United States Patent [19]

Kopnick et al.

[11] 4,360,560

[45] Nov. 23, 1982

[54] BASE MATERIAL FOR THE PRODUCTION OF PRINTED CIRCUITS AND PROCESS FOR THE PREPARATION OF THE BASE MATERIAL

[75] Inventors: Siegfried Kopnick; Dirk Huthwelker; Arnold Franz, all of Troisdorf; Lothar Jacob, Eckhausen, all of Fed. Rep. of Germany

[73] Assignee: Dynamit Nobel Aktiengesellschaft, Troisdorf, Fed. Rep. of Germany

[21] Appl. No.: 18,734

[22] Filed: Mar. 8, 1979

[51] Int. Cl.³ .................. B32B 27/04; B32B 27/30; B32B 27/42; B32B 31/12; H05K 1/00
[52] U.S. Cl. ............................... 428/236; 156/90; 156/307.4; 156/307.5; 156/315; 156/327; 156/335; 174/68.5; 428/249; 428/251; 428/252; 428/284; 428/285; 428/286; 428/288; 428/290; 428/506; 428/901
[58] Field of Search ............. 428/506, 901, 236, 249, 428/251, 252, 284, 285, 286, 288, 290; 156/90, 307.4, 307.5, 315, 327, 335; 174/68.5

[56] References Cited

U.S. PATENT DOCUMENTS

| | | | |
|---|---|---|---|
| 3,560,328 | 2/1971 | Anderson et al. | 428/249 |
| 3,617,613 | 11/1971 | Benzinger et al. | 428/215 |
| 3,804,693 | 4/1974 | Nichols | 156/335 |
| 3,897,588 | 7/1975 | Nohtomi | 156/307.5 |
| 3,972,765 | 8/1976 | Kondo | 156/315 |
| 4,031,313 | 6/1977 | Franz et al. | 428/531 |
| 4,074,015 | 2/1978 | Franz | 428/531 |

*Primary Examiner*—James C. Cannon
*Attorney, Agent, or Firm*—Antonelli, Terry & Wands

[57] ABSTRACT

A base material for the production of printed circuits according to the additive method includes a laminate base made up of laminated-together core sheets impregnated with hardenable resin, and a cover layer made up of a substrate sheet preimpregnated with phenolic resol resin and provided with an adhesive layer of an elastomeric polymer. The preimpregnated substrate sheet is also provided with a further resin impregnation containing a self-crosslinking copolymer of acrylic monomers and up to 30% by weight of a hardenable phenolic resol resin.

5 Claims, No Drawings

BASE MATERIAL FOR THE PRODUCTION OF PRINTED CIRCUITS AND PROCESS FOR THE PREPARATION OF THE BASE MATERIAL

The invention relates to a base material for the production of a printed circuit by the "additive method" wherein the printed circuit is made up of laminated-together core sheets impregnated with hardenable resins, such as epoxy, phenolic, melamine, polyester, silicone resins or similar materials and a cover layer made up of a substrate sheet preimpregnated with phenolic resol (A-stage) resins and applied with an adhesive layer containing an elastomer. Base materials for the production of printed circuits according to "additive" or "semiadditive" methods are described, for example, in DAS (German Published Application) No. 1,665,314, as well as in DOS (German Unexamined Laid-Open Application) No. 2,633,094; in particular, these applications disclose in detail the properties and the composition of the adhesive layer constituting the adhesion-promoting agent between the base material and the printed circuit pattern to be applied without the use of current.

The invention also relates to a process for the production of a base material of the type mentioned in the foregoing. It has been known from the art, as executed in practice, to apply coating adhesives having an elastomer basis to the base material by the dipping or casting method.

Disadvantages of a casting-type adhesive coating results from the dust particles that are unavoidably present on the surface of the base material, thereby preventing the creation of a uniformly thick film of the adhesive coating and consequently causing fluctuations in the adhesive strength of the metallic film applied subsequently without the use of current. Moreover, uneven surfaces of the metallic film are often produced. Another disadvantage resides in the fact that the cut-to-size sections of the base materials, which are to be coated, result in adhesive layers of nonuniform thickness, formed especially by the phenomenon that solvent-containing coating adhesives recede from the edges. Also, base materials to be coated in this way can exhibit further occlusions of foreign bodies on the surface of the adhesive film, making a coating at this location impossible. This creates zones which later on cannot be coated with a metallic film without the formation of voids.

One disadvantage of a varnishing method resides, above all, in that the coating adhesive, in case of laminates to be coated on both sides, is applied in two process steps first to one side and, after drying of the coating, to the other side; this requires special measures to convert both layers to the same condition, especially with respect to the degree of hardening. Similar difficulties can arise if the coating adhesive is to be applied by the dipping method since, when following this procedure, there is the danger that the coating thickness cannot be kept uniform over the entire surface.

Also, attempts have been made, as described in DOS No. 2,140,979, to apply the layer of adhesive to the base material by laminating and bonding the adhesive layer, consisting of an adhesive-impregnated substrate sheet, to the remaining core sheets forming the laminated material, which have been impregnated, thus forming a composite under hardening of the resin and of the adhesive. However, it has been found that the adhesive-impregnated substrate sheet, during the laminating step, does not provide adequate layer bonding force to the remaining, resin-impregnated core sheets of the base material, and the adhesive-impregnated substrate sheet can subsequently be detached again. Therefore, the suggestion has been advanced in DOS No. 2,140,979 to preimpregnate the substrate sheet to be coated with the adhesive with the same binder resin used to impregnate the core sheets of the base material, and then to coat these preimpregnated substrate sheets, serving as the cover layers, with an adhesive and to predry same, and to laminate the layered parcel together with the use of pressure. By the preimpregnation of the substrate sheet, which serves as the cover layer, an intimate bonding to the core pack of the base material is to be achieved. However, it has been found that even this mode of operation does not result in adequate bonding between the layers of the coated substrate sheets and the remaining core sheets of the base material. The reason therefor is to be seen in that, for base material intended for the preparation of printed circuits, for example, a substrate sheet of paper of 80–120 g./cm$^2$, is preimpregnated with a low-molecular phenolic resol resin to obtain the corresponding, good electrical values. For the cover layer, an adhesive, for example on the basis of acrylonitrile-butadiene, is then applied to this preimpregnated paper and dried. After the lamination of this adhesive-coated, preimpregnated substrate sheet with additional core sheets impregnated with phenolic resol resins, to form a base material, the adhesive-coated cover sheet, however, can readily be detached again, since there is no layer bonding between the substrate sheet and the core. This is so, because the impregnating resin of the substrate sheet is polymerized to a greater degree than desired because of the dual drying procedure—the predrying after the preimpregnation and the post drying during the drying of the adhesive layer—and thus this resin can no longer develop a sufficient bonding function with respect to the remaining core sheets. One could get the idea of improving the layer bonding between the adhesive-coated cover layer and the remaining core sheets by post-impregnating the preimpregnated cover sheet substrate with phenolic or cresol resol resins or modified epoxy resins, drying same, and then coating same with an adhesive. This mode of operation also fails due to the fact that the known hardenable resin systems utilized for the production of the base materials by the press-molding of resin-impregnated core sheets advance too far in their polymerization during the multiple drying steps which they must undergo, so that they have no longer a sufficient flow (resin exudation) to ensure the necessary thorough layer bonding during the laminating step. However, if the drying processes are not conducted to the adequate degree, then the solvent contained in the substrate sheet is not sufficiently removed and the solvent subsequently causes bubbles in the adhesive layer or the migration of the impregnating resin of the core sheets into the adhesive layer.

The process of this invention for producing a base material of the type described hereinabove is based on the known method wherein the core sheets are impregnated with a hardenable resin solution and are dried at temperatures of 100°–140° C. under prepolymerization of the resin, and thereafter the substrate sheet forming the cover layer is preimpregnated and coated with an adhesive and dried, and the thus-coated sheets are pressed together and bonded with the use of pressure and at temperatures of 130°–170° C., under hardening of the resin and of the adhesive.

The invention is based on the problem of providing a base material and a process for the preparation of such a base material of the type mentioned in the foregoing wherein a flawless, uniform adhesive layer is ensured having a satisfactory surface characteristic and a perfect bonding of the layers.

The invention solves the thus-posed problem in a base material of the type mentioned hereinabove by providing the preimpregnated substrate sheet with a second resin impregnating material containing a self-crosslinking copolymer on the basis of acrylic derivatives and up to 30% by weight of a hardenable phenolic resol resin.

It has now been found surprisingly that the further or second impregnating material selected in accordance with this invention is suitable for establishing the flawless bonding to the adhesive layer and furthermore also the flawless layer bonding to the impregnated core sheets during the lamination of the layered composite forming the printed circuit. This fact is surprising insofar as the preimpregnated substrate sheet, provided with a second impregnating layer of this invention, no longer exhibits any flow after predrying, as determined by testing the flow, as is customary in the production of the base material. Measuring the flow (resin exudation) serves for determining the polymerization condition of the resin at a specific temperature and under a specific pressure. Normally, base materials having a flawless bonding of the layers can be produced from the impregnated core sheets by laminating only if all sheets still show resin exudation after impregnation and drying. It is astonishing that, although the substrate sheets impregnated according to the invention and coated with an adhesive no longer exhibit any flow, they can still be perfectly well bonded together by pressure. This can only be explained by the good adhesive properties of the additional impregnating material selected in accordance with the present invention.

According to the invention, a resin application is proposed for the second impregnation of the substrate sheet which contains 15–25% by weight of a phenolic resol resin and 85–75% by weight of a self-crosslinking copolymer prepared from a mixture containing 40–80% by weight of acrylonitrile, 15–55% by weight of an acrylic acid ester, i.e. methyl-, ethyl- or butylester and 1–10%, preferably 1–5% by weight of acrylic acid.

In this connection, the preferred copolymers are those having a basis of acrylonitrile and an acrylic acid ester such as butyl acrylate. The acrylic acid effects the subsequent crosslinking with its free carboxy groups. The proportion of hardenable phenolic resol resins in the impregnation utilized according to this invention is to convey approximately the thermal and mechanical properties found in the resin used for the impregnation of the remaining core sheets of the base material, which is normally made up on the same basis.

The amount of resin application for the substrate sheet to be coated with the adhesive is chosen preferably so that the initial impregnation corresponds to a resin application of 5–30% by weight and the second impregnation corresponds to a resin application of 70–150% by weight.

The impregnating layer provided in accordance with this invention has the further advantage that it forms a barrier layer between the adhesive and the remaining base material, so that a plasticizer migration from the base material into the adhesive layer is blocked during the subsequent heat treatments occurring in the production of the printed circuits.

Suitable as the core and substrate sheets for the preparation of base materials for printed circuits are flat fibrous materials formed of natural or synthetic organic fibers. Especially advantageous are types of paper, e.g. cotton papers, or also those of sulfate or sulfite pulp, non-woven fleeces, layers, mats, or fabrics of cellulose, fibers, or strips of synthetic fibers, such as polyesters, polyamides, or other polymeric, organic substances. Moreover, the fibrous material can be made up on the basis of inorganic mineral substances, such as glass fibers, spun glass fibers, glass mats, mineral wool, asbestos fibers.

As impregnating or binder resins for the core sheets are used those hardenable resins, such as, for example, epoxy, phenolic, melamine, polyester, or silicone resins, inter alia which are known for the impregnation of fibrous materials and described e.g. in U.S. Pat. Nos. 3,922,459 or 3,804,693. Usable adhesives are combinations of hardenable resins with a natural or synthetic rubber which can be oxidized and degraded. Useful types of rubber are, for example, butadiene-styrene, butadiene-acrylonitrile-styrene, and butadiene-acrylonitriles. Preferably, phenolic resol resins or epoxy resins are utilized as the hardenable resin components in the adhesive.

The core sheets which are impregnated according to known processes with the hardenable resins and dried are utilized for the preparation of the base materials, wherein the hardenable resin has already reached a prepolymerization stage but still exhibits a certain resin exudation (equals flow); these are the so-called prepreg resins. The process of this invention for the preparation of base materials with an adhesive layer, starting with the conventional processes, is distinguished by the features that the preimpregnated, predried substrate sheet, serving as the cover layer, is impregnated with a further hardenable resin material containing a self-crosslinking copolymer on the basis of acrylic derivatives and is dried at a temperature of between 110° and 180° C., and thereafter the adhesive is applied preferably with a layer thickness of 30–50μ and dried at a temperature of 130°–150° C.

Thus, according to the process of this invention, the adhesive is applied to the substrate sheet, serving as the cover layer, of the laminate forming the base material, with the use of an additional impregnation and a drying step, and then this substrate sheet, thus provided with adhesive, is compressed together with the remaining prepregs in one working step to form the desired laminate product or base material. The individual process steps are conducted in relatively narrow temperature ranges, which concerns, in particular, the drying or the individual impregnations and the adhesive layers after their application, so as not to endanger, due to a too extensive, early polymerization of the hardenable resins, the production of a sufficiently firm layer bondage during the subsequent press-molding of the entire layered product. On the other hand, it is necessary to select the drying temperature to be at such a level that water and solvent are removed at any event.

In a preferred embodiment of the process according to the invention, the second impregnation is carried out with an aqueous dispersion of a solids content of 35–50% in the form of up to 30% by weight, preferably 15–25% by weight of a phenolic resol resin and 85–75% by weight of a copolymer prepared from a monomeric mixture containing 40–80% by weight of acrylonitrile, 15–55% by weight of acrylic acid ester, and 1–10% by weight of acrylic acid as described in U.S. Pat No. 4,031,313.

During the pressing step which takes place according to known process-steps to produce the laminate product, a uniform crosslinking of the crosslinkable proportions of the impregnation of the substrate sheet takes place, and a uniform hardening of the hardenable resin components is attained in all sheets, so that the firm bonding of the individual layers of core sheets and substrate sheets to one another and to the adhesive layer is ensured.

The invention will be explained hereinbelow with reference to an example.

The base material to be prepared consists of eight core sheets and one substrate sheet coated with adhesive and forming a cover layer. The core sheet employed is a paper having a weight per unit area of 60–180 g./m$^2$. All nine sheets are preimpregnated in a first process step with a 20% phenolic resol solution in methanol, having a viscosity of about 10 cp., thus obtaining an approximately 10% resin application. After these preimpregnated sheets have been dried at a temperature of about 130° C., the eight sheets constituting the core of the base material are impregnated with a further, approximately 60% phenolic resol solution in methanol with the usual additives, such as plasticizers, flameproofing agents, fillers, etc., thus obtaining a resin application of about 100%.

The substrate sheet, constituting the cover sheet, which is to be coated with adhesive and which has been preimpregnated as described above, is now impregnated with an aqueous dispersion having a viscosity of about 10–20 cp., containing 40% solids in the form of 15 parts by weight of phenolic resol resin and 85 parts by weight of a copolymer of 60 parts by weight of acrylonitrile, 22 parts by weight of butyl acrylate, and 3 parts by weight of acrylic acid, so that a resin application of about 100% is obtained. Subsequently, a rubber acrylonitrile-butadiene-containing adhesive, for example the adhesive "KN 171" By HESSE, Federal Republic of Germany, is applied with the aid of doctor blades to the thus-impregnated substrate sheet. The uniform layer thickness of the adhesive is about 40μ. This substrate sheet, coated with adhesive, is then again dried thoroughly at about 130°–150° C., to prevent a subsequent tearing of the adhesive during the subsequent pressing step.

If the flow is measured on the adhesive-coated and dried substrate sheet, it is found that this sheet no longer exhibits any flow, i.e. any resin exudation. Yet, during the subsequent press-molding step wherein the eight impregnated core sheets are bonded together under pressure with the adhesive-coated substrate sheet placed thereon, in a heated press under a specific pressure of 50–150 kp./cm$^2$, preferably about 120 kp./cm$^2$ and at a temperature of between 130° and 180° C., preferably 160°, and after cooling of the material under pressure, a flawlessly laminated base material coated unilaterally with adhesive is obtained. The process can be utilized analogously for base material adhesive-coated on both sides for the production of such base material with equally good results on both sides.

What is claimed is:

1. A base material for the production of printed circuits according to the additive method which comprises a laminate base made up of laminated-together core sheets impregnated with hardenable resin, and a cover layer made up of a substrate sheet preimpregnated with phenolic resol resin and provided with an adhesive layer of an elastomeric polymer, said preimpregnated substrate sheet being provided with a further resin impregnation containing a self-crosslinking copolymer of acrylic monomers and up to 30% by weight of a hardenable phenolic resol resin.

2. A base material according to claim 1, wherein in that the preimpregnation of the adhesive-coated substrate sheet has a resin content of 5–30% and the further impregnation has a resin content of 70–150%.

3. A base material according to claim 1, wherein the resin composition for the further impregnation of the substrate sheet contains 15–25% by weight of a phenolic resol resin and 85–75% by weight of a copolymer containing 40–80% by weight of acrylonitrile, 15–55% by weight of acrylic acid ester, and 1–10%, preferably 1–15% by weight of acrylic acid.

4. A process for the preparation of a base material for forming printed circuits which comprises impregnating a plurality of core sheets with a hardenable resin solution, drying the resin impregnated core sheets at temperatures of 100°–140° C. to effect prepolymerization of the resin, then preimpregnating a substrate sheet constituting a cover layer with a phenolic resol resin, coating this cover layer with a rubber adhesive and then drying the cover layer, pressing the thus-layered sheets, with the use of pressure and at temperatures of 130°–170° C., together to bond the sheets under hardening of the resin and of the adhesive, the preimpregnated, predried substrate sheet serving as the cover layer being impregnated with a further hardenable resin material containing a self-crosslinking copolymer on the basis of acrylic derivatives and up to 30 parts by weight of a hardenable phenolic resol resin, and being dried at a temperature of between 110° and 180° C., whereafter the adhesive is applied preferably in a layer thickness of 30–50μ and dried at temperatures of 130°–150° C.

5. A process according to claim 4, characterized in that the further hardenable resin material containing a self-crosslinking polymer is an aqueous dispersion containing 35–50% solids proportions in the form of up to 30% by weight, preferably 15–25% by weight of a phenolic resol resin and 75–85% by weight of a copolymer containing 40–80% by weight of acrylonitrile, 15–55% by weight of acrylic acid ester, and 1–10% by weight of acrylic acid.

* * * * *